(12) United States Patent
Coudrain et al.

(10) Patent No.: US 8,828,797 B2
(45) Date of Patent: Sep. 9, 2014

(54) PROCESS FOR ASSEMBLING TWO PARTS OF A CIRCUIT

(75) Inventors: Perceval Coudrain, Grenoble (FR); Yacine Felk, Avully (CH); Patrick Lamontagne, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 245 days.

(21) Appl. No.: 13/222,317

(22) Filed: Aug. 31, 2011

(65) Prior Publication Data

US 2012/0052629 A1 Mar. 1, 2012

(30) Foreign Application Priority Data

Sep. 1, 2010 (FR) ..................................... 10 56942

(51) Int. Cl.
| | | |
|---|---|---|
| *H01L 21/77* | (2006.01) | |
| *H01L 23/00* | (2006.01) | |
| *H01L 25/065* | (2006.01) | |
| *H01L 25/00* | (2006.01) | |

(52) U.S. Cl.
CPC ....... *H01L 24/92* (2013.01); *H01L 2224/32145* (2013.01); *H01L 2225/06527* (2013.01); *H01L 25/0657* (2013.01); *H01L 2224/83894* (2013.01); *H01L 2225/06541* (2013.01); *H01L 2225/06513* (2013.01); *H01L 2924/01073* (2013.01); *H01L 2924/01033* (2013.01); *H01L 2924/01029* (2013.01); *H01L 24/94* (2013.01); *H01L 2224/05687* (2013.01); *H01L 2224/80896* (2013.01); *H01L 25/50* (2013.01); *H01L 2224/9202* (2013.01); *H01L 2924/01006* (2013.01); *H01L 2924/01005* (2013.01); *H01L 24/80* (2013.01); *H01L 2924/01087* (2013.01)
USPC .......................................... 438/107; 438/687

(58) Field of Classification Search
None
See application file for complete search history.

(56) References Cited

U.S. PATENT DOCUMENTS

| | | | | |
|---|---|---|---|---|
| 5,506,450 A | * | 4/1996 | Lee et al. ...................... | 257/767 |
| 6,144,095 A | * | 11/2000 | Sandhu et al. ................ | 257/750 |
| 6,156,626 A | | 12/2000 | Bothra | |
| 6,355,147 B1 | * | 3/2002 | Griffiths et al. .............. | 204/242 |
| 2004/0239318 A1 | * | 12/2004 | Xiao et al. .................... | 324/244 |
| 2008/0205027 A1 | | 8/2008 | Coronel et al. | |
| 2008/0268587 A1 | * | 10/2008 | Sadaka et al. ................. | 438/199 |

(Continued)

FOREIGN PATENT DOCUMENTS

| | | |
|---|---|---|
| FR | 2913145 A1 | 8/2008 |
| JP | 2009267098 A | 11/2009 |

OTHER PUBLICATIONS

French Search Report mailed Mar. 14, 2011 for FR 1056942 (12 pages).
English language Abstract for JP 2009267098 A (1 page).

(Continued)

*Primary Examiner* — Charles Garber
*Assistant Examiner* — Stanetta Isaac
(74) *Attorney, Agent, or Firm* — Gardere Wynne Sewell LLP

(57) ABSTRACT

A three-dimensional integrated structure is fabricated by assembling at least two parts together, wherein each part contains at least one metallic line covered with a covering region and having a free side. A cavity is formed in the covering region of each part, that cavity opening onto the metallic line. The two parts are joined together with the free sides facing each other and the cavities in each covering region aligned with each other. The metallic lines are then electrically joined to each other through an electromigration of the metal within at least one of the metallic lines, the electromigrated material filling the aligned cavities.

21 Claims, 4 Drawing Sheets

(56) References Cited

U.S. PATENT DOCUMENTS

2010/0187583 A1* 7/2010 Wrazien et al. .............. 257/295
2012/0252189 A1* 10/2012 Sadaka et al. ................ 438/455
2013/0020704 A1* 1/2013 Sadaka ......................... 257/741

OTHER PUBLICATIONS

Leduc, P., et al.: "Challenges for 3D IC Integration: Bonding Quality and Thermal Managment," 2007 IEEE (pp. 210-212).

Charlet, B., et al.: "Direct Wafer and Die Bonding Technology Applied to 3D Integration on Silicon: Recent Results at LETI," published in 2006 (6 pages).

Suntharalingam, Vyshnavi, et al.: "Megapixel CMOS Image Sensor Fabricated in Three-Dimensional Integrated Circuit Technology," 2005 IEEE International Solid-State Circuits Conference (pp. 356-357).

Koyanagi, Mitsumasa, et al.: "Three-Dimensional Integration Technology Based on Wafer Bonding With Vertical Buried Interconnections," IEEE Transactions on Electron Devices, vol. 53, No. 11, Nov. 2006 (pp. 2799-2808).

Morrow, P. R., et al.: "Three-Dimensional Wafer Stacking Via Cu-Cu Bonding Integrated With 65-nm Strained-Si/Low-k CMOS Technology," 2006 IEEE (pp. 335-337).

* cited by examiner

PROCESS FOR ASSEMBLING TWO PARTS OF A CIRCUIT

PRIORITY CLAIM

This application claims priority from French Application for Patent No. 1056942 filed Sep. 1, 2010, the disclosure of which is hereby incorporated by reference.

TECHNICAL FIELD

The invention relates to integrated circuits and more particularly to the assembly of two parts, for example independently fabricated integrated circuits, so as to produce a three-dimensional integrated structure.

BACKGROUND

Assemblies of integrated circuits generally comprise two integrated circuits fabricated independently and then connected to each other by a bonding method allowing the continuity of certain metallic lines between the two integrated circuits.

Actual assemblies generally comprise through silicon vias (TSVs) intended to connect to a second integrated circuit by passing through the entire thickness of one of the two silicon substrates. The production of such TSVs comprises thinning of one of the two substrates, a deep reactive-ion etch, and bonding, possibly requiring an adhesive.

Production of these TSVs has the drawbacks of increasing the fabrication time of the assembly and of being costly.

It has been proposed to produce interconnects through silicon-on-insulator (SOI) substrates. These interconnects pass through the oxide layers of SOI substrates from which the silicon layer forming the bulk substrate has been removed. The oxide layer of these substrates provides the necessary vertical insulation between the components.

This technique has the drawback of being applicable only to SOI substrates.

The approach, called "direct bond interconnect", of the American company Ziptronix, allows two integrated-circuit parts to be assembled by directly bonding the layers containing oxide and metal.

It has also been proposed to capacitively couple the metallic lines by bonding only the oxide, after a planarization step. Capacitive connections have the drawback that they can be used only for certain applications, and the reduction of their dimensions is limited.

Finally, it has been proposed to bond the oxide covering two integrated-circuit parts, leaving cavities that open onto the metallic lines, and to anneal with volume expansion of the metal contained in the cavities until a metallic assembly is formed between the two integrated-circuit parts.

SUMMARY

According to one method of implementation, it is proposed to assemble two integrated circuits without metallic interconnects passing through the substrate of at least one integrated circuit.

According to another method of implementation, it is proposed to assemble two integrated circuits by bonding only the insulating regions covering the metallic interconnects.

According to one aspect, a process is therefore proposed for fabricating a three-dimensional integrated structure by assembly of at least two parts, each containing at least one metallic line covered with a covering region having a free side, comprising:

forming, in each part, at least one cavity in the covering region opening onto the metallic line;

joining of the two covering regions to each other by way of at least a portion of their free side so that said cavities face each other; and forming a metallic assembly of the two lines, comprising an electromigration of the metal of at least one of the metallic lines through the cavities.

Thus, the electromigration allows metal atoms to migrate from at least one of the metallic lines so as to fill the cavities.

Advantageously, the formation of the metallic assembly furthermore comprises an anneal carried out during the electromigration.

Combining the electromigration and the anneal accelerates the formation of a metallic assembly between the two lines.

Furthermore, the temperature is a factor that promotes electromigration.

The electromigration comprises making a current flow through at least one of the metallic lines of the two parts by means of at least two terminals in one of the two parts.

Furthermore, it is possible to control the formation of the metallic assembly of the two lines by measuring the increase in the resistance of the lines in which the electromigration takes place.

In this way, it is possible to stop the electromigration as soon as the metallic assembly is formed, thereby making it possible to precisely control the duration of the step.

Advantageously, the metallic lines in which the electromigration takes place are equipped with reservoirs of metallic material.

Thus, the formation of the metallic assemblies does not create faults within the metallic lines, the surplus material contained in the reservoirs making it possible to replace the migrated material.

The electromigration may take place within at least one line of each of the two parts.

The assembly may comprise respective assemblies of first integrated circuits on second integrated circuits fabricated within a semiconductor wafer.

The free sides of the first integrated circuits have a smaller area than the free sides of the second integrated circuits, and the electromigration is carried out by making a current flow through the metallic lines of the second integrated circuits by way of terminals in these second integrated circuits located outside of the respective, first integrated circuits.

As a variant, the first integrated circuits are fabricated within a semiconductor wafer, and the two wafers are assembled by assembling each integrated circuit of one wafer with an integrated circuit of the other wafer.

BRIEF DESCRIPTION OF THE DRAWINGS

Other advantages and features of the invention will become clear on studying the detailed description of methods of implementation and embodiments, given by way of non-limiting examples, and illustrated by the appended drawings in which.

DETAILED DESCRIPTION OF THE DRAWINGS

Figure 1:
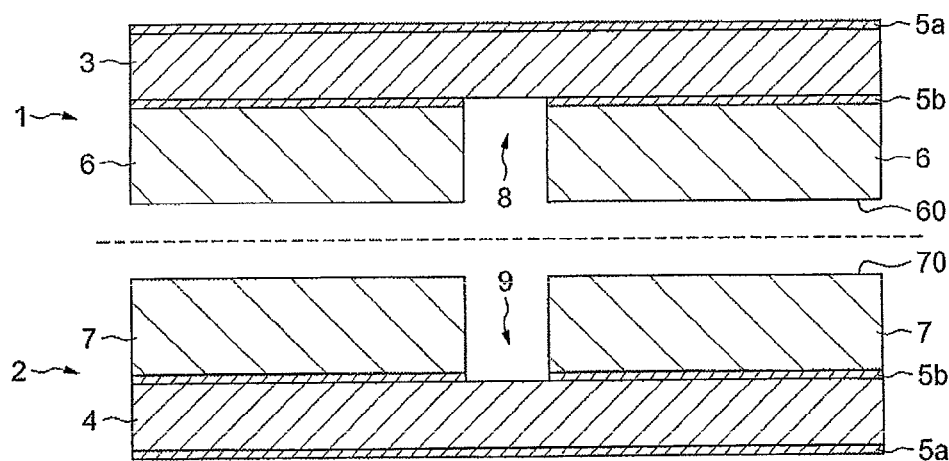
FIGS. 1 to 4 are views in cross section illustrating various steps of a method of implementation of the process according to the invention.

FIG. 1 is a view in cross section illustrating two parts, for example integrated-circuit parts 1 and 2, intended to be assembled so as to form a three-dimensional integrated structure. The semiconductor chip of each of the two parts 1 and 2 is not shown in its entirety for the sake of simplicity. Thus the part that is not shown (located above part 1 and below part 2) could contain transistors or any other known semiconductor device.

The part 1 comprises a metallic line 3 and the part 2 comprises a metallic line 4. Advantageously, these metallic lines are placed on the highest metallization level of each of the integrated circuits 1 and 2, for example, the seventh or eighth metallization level of an integrated circuit, in which the metallic lines have a thickness of about a micron.

The metallic lines 3 and 4 are here surrounded by two encapsulation layers 5a and 5b. For copper metallic lines 3 and 4, the lower encapsulation layer 5a may be formed of a first tantalum nitride layer that limits the diffusion of copper into the silicon, a second tantalum layer improves the adhesion of the copper, and a third copper layer (not shown) makes it possible to deposit the copper of lines 3 and 4 by electrolysis. The upper layer 5b is formed by a SiCN layer.

An insulating region 6 is formed on the metallic line 3 and a second insulating region 7 is formed on the metallic line 4. The insulating regions 6 and 7 may be made of silicon oxide.

The layers 5a and 5b and the insulating region 6 form a covering region having a free side 60. The layers 5a and 5b and the insulating region 7 form a covering region having a free side 70.

In the integrated-circuit part 1, the insulating region 6 and the encapsulation layers 5a and 5b are etched so as to form a cavity 8 that opens onto the metallic line 3.

In the same way, a cavity 9 opening onto the metallic line 4 is formed in the integrated circuit 2.

The cavities 8 and 9 have dimensions of the order of a micron, thereby allowing many of these cavities to be integrated into the same integrated circuit.

Advantageously, the formation of the cavities 8 and 9 is followed by a step of preparing the surface of the covering regions (6, 7) with a chemical-mechanical polish.

Figure 2:
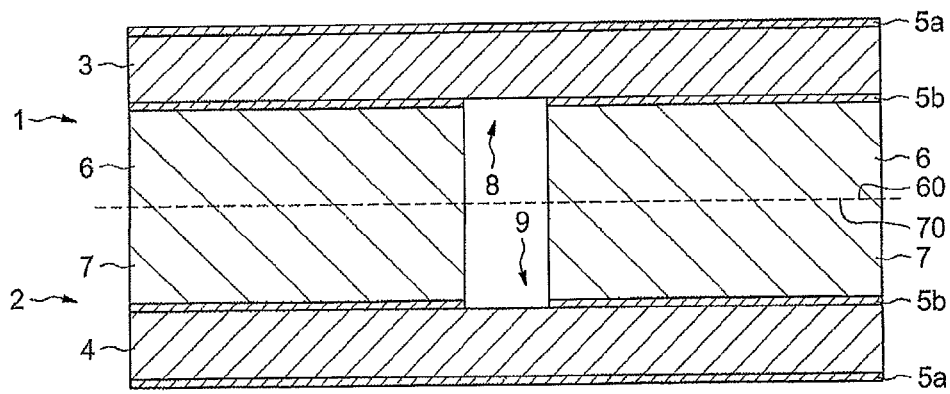

FIG. 2 illustrates the step of joining the two parts 1 and 2. This step here comprises direct bonding (sometimes called molecular bonding). The chemical-mechanical polish makes such a bond of the insulating regions 6 and 7 possible by way of the free sides 60 and 70. The joining step may furthermore be preceded by an alignment step.

Figure 3:
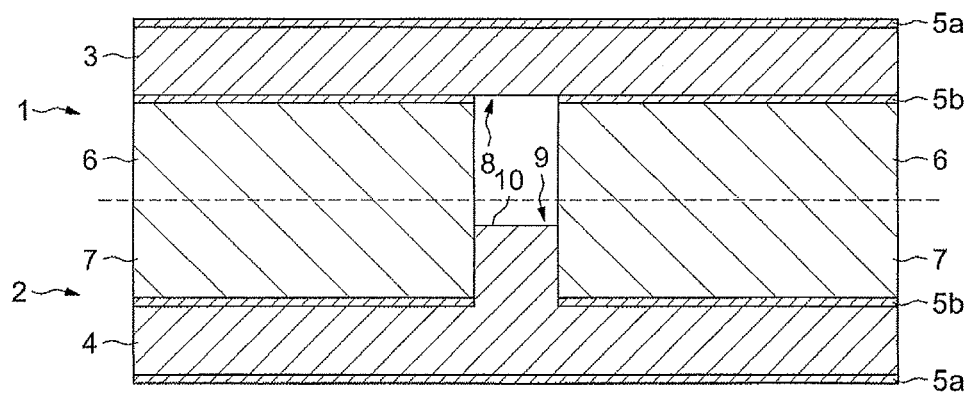

By making a current flow through the line 4, electromigration of the metal of the line 4 begins to fill the cavity 9, as illustrated in FIG. 3. The cavity 9 is therefore partially filled by an outgrowth 10 of the metal.

The current density applied to the line must be high enough to cause the electromigration, for example a current density of $5 \times 10^6$ A/cm$^2$ may be used.

An anneal may be carried out at the same time as the electromigration. The temperature will accelerate the electromigration effect, for example a temperature of about 400° C. may be used.

Figure 4:
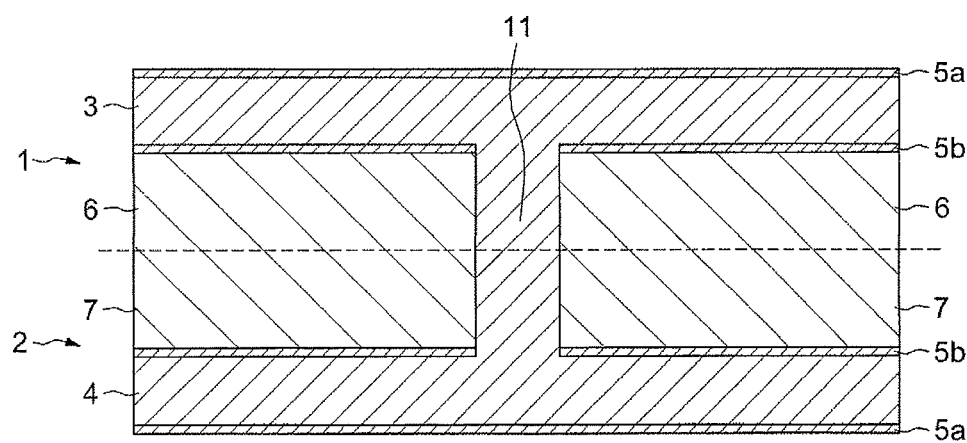

The process continues until a metallic assembly 11 is obtained between the two lines 3 and 4 (FIG. 4).

Figure 5:
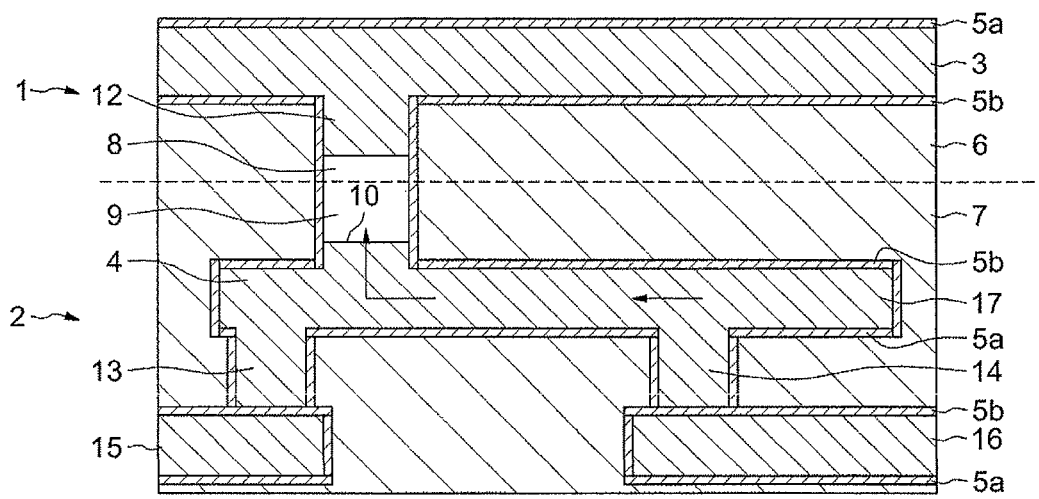
FIGS. 5 to 8 are views in cross section illustrating other methods of implementation of the process according to the invention.

FIG. 5 is a view in cross section of an assembly of the part 1 with another integrated-circuit part 2.

The view in cross section of this figure is shown during the electromigration. A current was made to flow through the line 3 so as to partially fill the cavity 8 with metal 12, and the cavity 9 has been partially filled with metal 10.

The integrated-circuit part 2 comprises another metallization level, connected to the line 4 by two vias 13 and 14 which join the metallic lines 15 and 16, respectively.

The current made to flow through the line 4 causes a migration of material from the anode located on the right of the figure towards the cavity 9. In order to prevent faults appearing within the line 4, a reservoir 17 is placed at the cathode.

The dimensions of this reservoir 17 are advantageously chosen so that the volume of the reservoir 17 is greater than the volume required to form the metallic assembly 11, for example volumes lying between 0.12 μm$^3$ and 0.25 μm$^3$.

The use of the reservoir 17 enables enough metallic material to migrate for the metallic assembly 11 to form without causing faults in or severing of the line 4.

In this embodiment, the reservoir 17 is of the same thickness as the metallic line 4. As a variant, it could be of different thickness, as illustrated in FIGS. 7 and 8.

Figure 6:
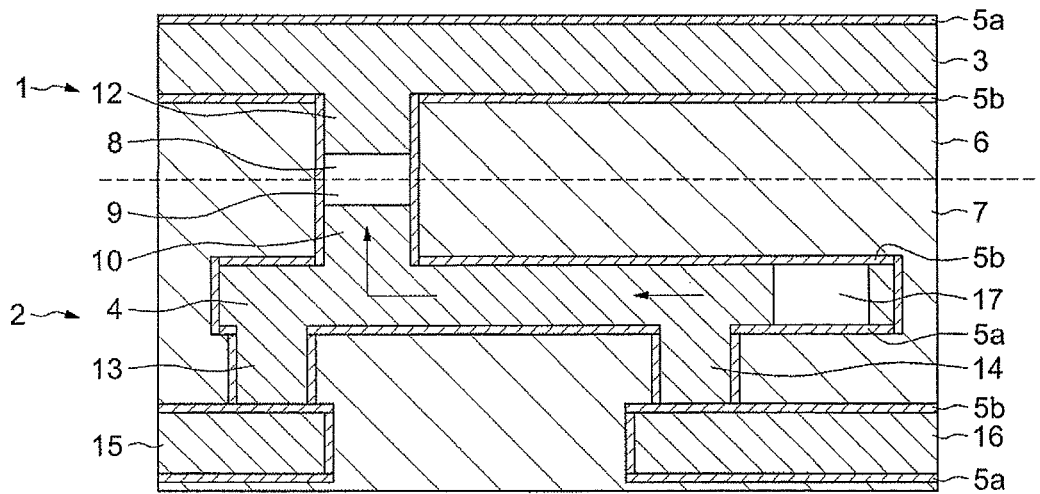

FIG. 6 shows a more advanced stage in the electromigration, in which the reservoir 17 now comprises a cavity, and the outgrowths 10 and 12 almost form the metallic assembly 11.

The cavity formed in the reservoir 17 does not cause an electrical fault because it does not interrupt the flow of the current through the line 4.

Figure 7:
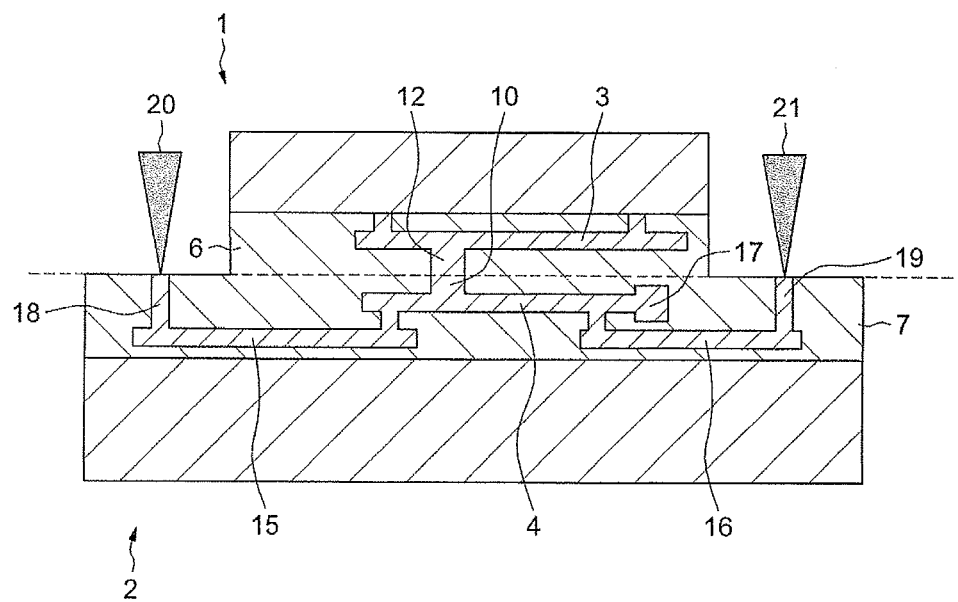
Figure 8:
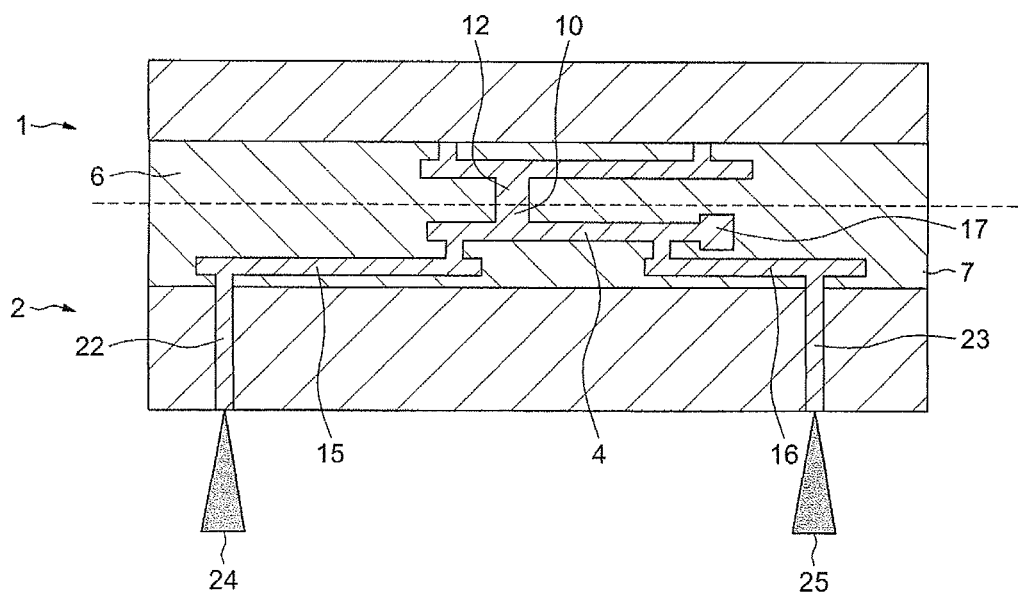

FIG. 7 is a view in cross section of an assembly of two integrated circuits shown in their entirety, and in which the metallic lines 3, 4, 15 and 16, the outgrowths 10 and 12 and the reservoir 17 can, furthermore, be seen.

The metallic lines 15 and 16 are respectively connected to TSVs 18 and 19 that open through the insulating region 7.

Moreover, the integrated circuit 1 is, in this method of implementation according to the invention, smaller than the integrated circuit 2.

Several integrated circuits 2 can be part of a semiconductor wafer whilst several circuits 1 are separate circuits fabricated independently of the circuits 2. It is thus possible to obtain a three-dimensional structure comprising a wafer of integrated circuits respectively assembled with separate integrated circuits.

The TSVs 18 and 19 therefore do not open onto the integrated circuit 1 and are therefore accessible. These TSVs 18 and 19 are therefore terminals to which electrodes 20, 21 can be connected so as to make a current flow through the metallic line 4 during the electromigration.

Another method of implementation is shown in FIG. 8. In this method of implementation, the lines 15 and 16 are connected to TSVs 22 and 23 (formed extending through the substrate of the integrated circuit part).

These TSVs 22 and 23 open onto the back side of the integrated circuit 2. It should be noted that the integrated circuit 1 has the same dimensions as the integrated circuit 2.

The TSVs 22 and 23 therefore make it possible to connect electrodes 24 and 25 to the integrated-circuit part 2 so as to make a current to flow through the line 4.

The integrated circuits 1 may be on a first semiconductor wafer, and the circuits 2 may be on a second semiconductor wafer. It is also possible to assemble the two wafers by way of the respective integrated circuits. The two wafers will subsequently be diced so as to obtain the various three-dimensional structures each comprising two assembled integrated circuits.

Furthermore, the two methods of implementation described in FIGS. 7 and 8 may be combined, for example by using TSVs in the integrated circuit 1 in FIG. 7. A current may therefore also be made to flow through line 3 and the formation of the metallic assembly 11 is therefore accelerated.

It is also possible to use TSVs in both integrated circuits.

The electrodes 20, 21, 24 and 25 furthermore make it possible to measure the resistance of the metallic lines 3, 15 and 16 during the electromigration. Thus, it is possible to monitor the formation of the metallic assembly 11 by measuring this resistance increase.

By virtue of the invention, a process for assembling two integrated circuits is obtained, which comprises only bonding of two oxides, and which is more effective than bonding with anneal and expansion of the metal.

What is claimed is:

1. A process for fabricating a three-dimensional integrated structure by assembly of at least two parts, each part containing at least one metallic line covered with a covering region having a free side, comprising:
    forming, in each part, at least one cavity in the covering region opening onto the metallic line;
    forming one or more reservoirs of conductive material in one or more of the metallic lines;
    joining of the two covering regions to each other by way of at least a portion of their free side so that said cavities face each other; and
    forming a metallic assembly of the two lines, comprising performing an electromigration of the metal of at least one of the metallic lines through the cavities, wherein the combined volume of the one or more reservoirs is equal to or greater than a combined volume of the facing cavities.

2. The process according to claim 1, wherein forming said metallic assembly further comprises performing an anneal during the electromigration.

3. The process according to claim 1, wherein performing the electromigration comprises making a current flow through at least one of the metallic lines of the two parts by means of an electrical connection to at least two terminals of one of the two parts.

4. The process according to claim 1, wherein forming the metallic assembly of the two lines further comprises measuring an increase in the resistance of at least one of the lines during the electromigration.

5. The process according to claim 1, further comprising providing a reservoir of metallic material in at least one of the metallic lines in which the electromigration takes place.

6. The process according to claim 1, wherein the electromigration takes place within at least one line of each of the two parts.

7. The process according to claim 1, wherein said joining of the two covering regions to each other comprises preparing a surface of the free side of the covering regions.

8. The process according to claim 7, wherein said joining of the two covering regions to each other comprises direct bonding.

9. The process according to claim 1, in which each part is an integrated circuit.

10. The process according to claim 9, comprising respective assemblies of first integrated circuits on second integrated circuits fabricated within a semiconductor wafer.

11. The process according to claim 10, wherein the free sides of the first integrated circuits have a smaller area than the free sides of the second integrated circuits, and the electromigration is carried out by making a current flow through the metallic lines of the second integrated circuits by way of terminals in these second integrated circuits located outside of the respective, first integrated circuits.

12. The process according to claim 10, wherein the first integrated circuits are fabricated within a semiconductor wafer, and the two wafers are assembled by assembling each integrated circuit of one wafer with an integrated circuit of the other wafer.

13. A process, comprising:
    forming a first integrated part containing a first metallic line and a first covering over the first metallic line, the first covering having a first surface, and the first integrated part including a first opening extending from the first surface through the first covering to reach the first metallic line;
    forming a second integrated part containing a second metallic line and a second covering over the second metallic line, the second covering having a second surface, and the second integrated part including a second opening extending from the second surface through the second covering to reach the second metallic line;
    forming one or more reservoirs of conductive material in one or more of the first metallic line and the second metallic line;
    joining the first surface to the second surface with the first and second openings aligned with each other; and
    performing an electromigration with respect to at least one of the first and second metallic lines to electrically connect the first metallic line to the second metallic line through electromigrated conductive material filling the first and second opening, wherein the combined volume of the one or more reservoirs is equal to or greater than a combined volume of the aligned first and second openings.

14. The process of claim 13, wherein performing an electromigration comprises simultaneously performing an anneal.

15. The process of claim 13, wherein performing an electromigration comprises passing a current through at least one of the first and second metallic lines.

16. The process of claim 15 further comprising providing, using a through silicon via, an electrical connection to said at least one of the first and second metallic lines, and applying the current to the through silicon via.

17. The process of claim 13, further comprising measuring resistance of said at least one of the first and second metallic lines during electromigration.

18. The process of claim 13, wherein the first and second integrated parts are semiconductor integrated circuits.

19. The process of claim 13, wherein the first and second integrated parts are semiconductor integrated circuits wafers.

20. The process of claim 13, wherein forming the first integrated part containing the first metallic line further comprises forming a reservoir region coupled to the first metallic line and containing conductive material filling supporting electromigration.

21. The process of claim 13, wherein performing the electromigration comprises performing an electromigration with respect to both of the first and second metallic lines to electrically connect the first metallic line to the second metallic line through electromigrated conductive material filling the first and second openings.

* * * * *